(12) United States Patent
Fowler

(10) Patent No.: US 6,614,312 B1
(45) Date of Patent: Sep. 2, 2003

(54) LOW NOISE AMPLIFIER AND IMAGING ELEMENT USING SAME

(75) Inventor: Boyd Fowler, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/104,917

(22) Filed: Mar. 22, 2002

(51) Int. Cl.[7] ............................. H03F 3/08; H03F 1/36; H03F 3/04; H01J 40/14
(52) U.S. Cl. ..................... 330/308; 330/86; 330/110; 330/311; 250/214 A
(58) Field of Search ............................. 330/86, 98, 99, 330/110, 308, 311; 250/214 A

(56) References Cited

U.S. PATENT DOCUMENTS

| | | | | |
|---|---|---|---|---|
| 5,087,892 A | * | 2/1992 | Hayashi | ..................... 330/296 |
| 5,363,064 A | * | 11/1994 | Mikamura | ................... 330/308 |
| 5,801,588 A | * | 9/1998 | Nishiyama | ................... 330/308 |
| 5,818,620 A | * | 10/1998 | Akimoto et al. | ............ 359/189 |

* cited by examiner

Primary Examiner—Patricia Nguyen

(57) ABSTRACT

An imaging element that includes a photodiode and an amplifier for integrating photocurrent from the photodiode. The amplifier includes an input follower, a level shifter, and an output amplifier. The level shifter provides DC isolation between the follower output and the output amplifier. The input follower includes an input transistor connected to the photodiode, and the output amplifier has an input transistor connected to the level shifter. The sizes of these transistors are chosen such that the area of the input transistor in the input follower is less that the area of the input transistor in the output amplifier. The input follower preferably utilizes PMOS transistors.

14 Claims, 2 Drawing Sheets

LOW NOISE AMPLIFIER AND IMAGING ELEMENT USING SAME

FIELD OF THE INVENTION

The present invention relates to low noise amplifiers, and more particularly, to a high input impedance low input capacitance amplifier that is well suited for image sensors.

BACKGROUND OF THE INVENTION

While imaging arrays based on CCDs have become common, these arrays have two drawbacks. First, the technology used to fabricate such arrays has a significantly lower yield than that used to fabricate CMOS circuitry. CCD arrays have large areas of gate oxide. These areas are prone to electrical shorts. These electrical shorts, in turn, reduce the yield of useful chips, and hence, increase the cost of the devices.

The second problem with CCD arrays lies in the lower bound for the noise in the sensor arrays. Many imaging problems of interest require the imaging array to sense very low levels of light. The minimum level that an array can sense depends on the minimum noise in the sensors.

In principle, both of these drawbacks can be overcome by utilizing CMOS image sensors. The CMOS yields are significantly better than those of the CCD fabrication process. In addition, the minimum noise levels achievable with CMOS-based sensors are substantially lower than those that can be obtained with CCDs.

Each pixel of an image sensor typically includes a photodiode and an amplifier for amplifying the signal from the photodiode. If the image sensors are fabricated in sufficient volume, the fabrication line can be "tuned" to provide amplifiers with sufficiently low 1/f noise. The cost of the tuning and the costs associated with being restricted to a particular fabrication can be amortized over the large volume of devices. However, many image sensors of interest do not command such high volumes and must be compatible with a variety of production lines.

Broadly, it is the object of the present invention to provide an improved amplifier and image sensor utilizing the same.

These and other objects of the present invention will become apparent to those skilled in the art from the following detailed description of the invention and the accompanying drawings.

SUMMARY OF THE INVENTION

The present invention is an imaging element that includes a photodiode and an amplifier for providing an output signal indicative of the voltage across the photodiode. The amplifier includes an input follower, a level shifter, and an output amplifier. The input follower has a follower output having a signal related to the voltage across the photodiode. The level shifter isolates the follower output from the output amplifier input and has a first terminal connected to the follower output and a second terminal connected to the input of the output amplifier. The input follower includes an input transistor connected to the photodiode, and the output amplifier has an input transistor connected to the second terminal of the level shifter. The sizes of these transistors are chosen such that the area of the input transistor in the input follower is less than the area of the input transistor in the output amplifier. In the preferred embodiment of the present invention, the input follower utilizes PMOS transistors. The level shifter provides DC isolation between the input follower and the output amplifier. A shorting switch for shorting the input and output terminals of the output amplifier may also be included.

DETAILED DESCRIPTION OF THE INVENTION

Figure 1:
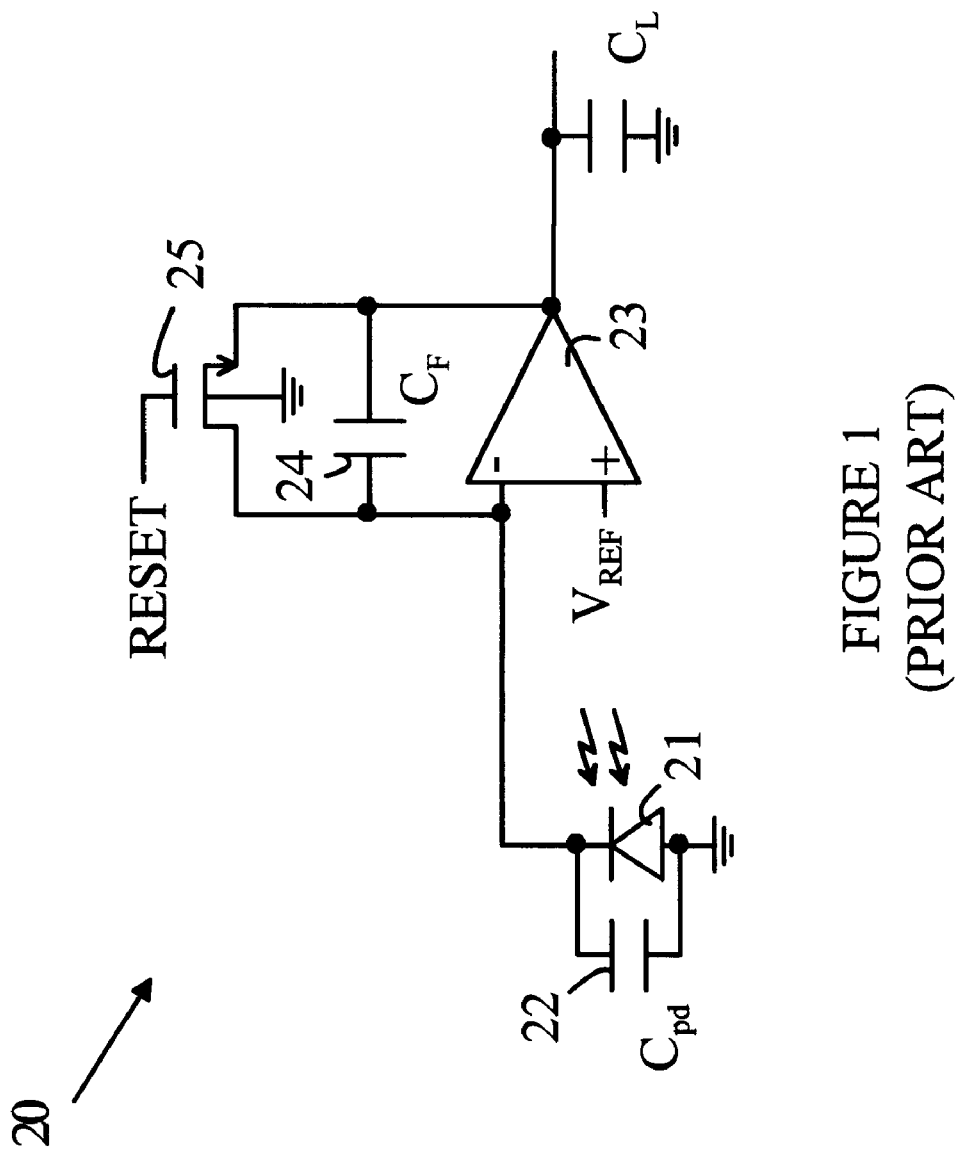
FIG. 1 is a schematic drawing of an imaging element 20 from a prior art image sensor array.

The manner in which the present invention obtains its advantages can be more easily understood with reference to FIG. 1, which is a schematic drawing of an imaging element 20 from a prior art image sensor array. Imaging element 20 includes a photodiode 21 and a capacitive transimpedance amplifier. The photodiode has a parasitic capacitance shown at 22. The capacitance of this capacitor will be denoted by $C_{pd}$ in the following discussion. $C_{pd}$ is normally set to be as small as possible because $C_{pd}$ is proportional to pixel size and pixel size is proportional to sensor cost.

The transimpedance amplifiers are constructed from an opamp (operational amplifier) 23 and a capacitive feedback loop consisting of capacitor 24. The capacitance of the feedback capacitor will be denoted by $C_F$ in the following discussion. The imaging element also has a reset switch for shorting the input and output of the opamp prior to accumulating charge. The reset switch is typically a transistor such as transistor 25.

In operation, the feedback capacitor is reset prior to a light measurement through switch 25. The photocurrent generated by the light signal is integrated on the feedback capacitor. The thermal noise of transimpedance amplifier is proportional to $(C_{pd} + C_{opamp})$ where $C_{opamp}$ is the input capacitance of the opamp. As noted above, $C_{pd}$ is small and set by the size of the photodiode. Hence, low thermal noise requires that the input capacitance of the opamp be small compared to $C_{pd}$ and that the gain of the opamp be high.

To provide low input capacitance in the amplifier stage, small area transistors must be utilized. However, high gain requires large area transistors. In addition, the 1/f noise increases with decreasing transistor size. While the noise can be reduced by careful tuning of the fabrication process, such tuning is not always an option.

Figure 2:
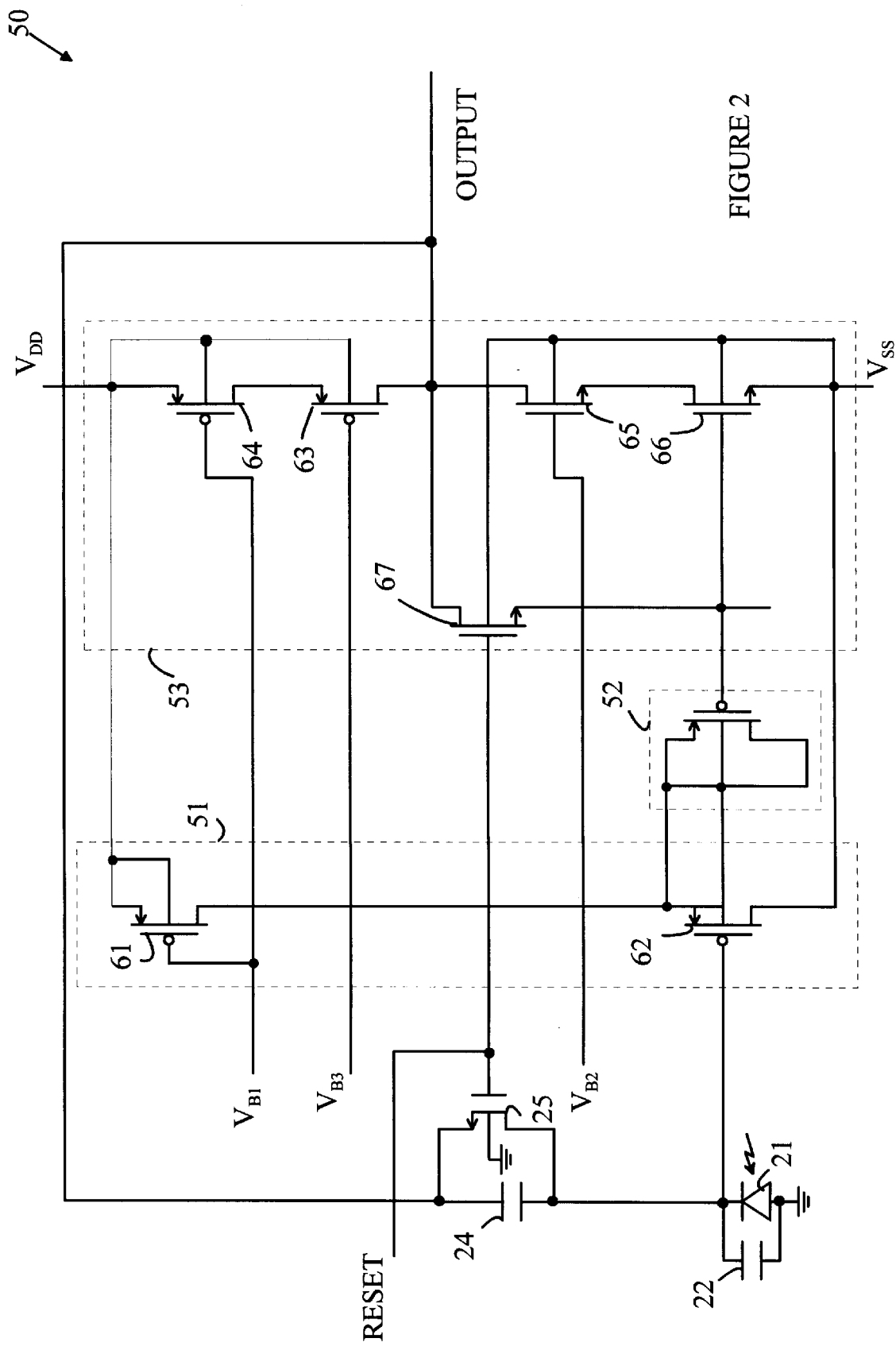
FIG. 2 is a schematic drawing of an imaging element 50 according to the present invention.

The present invention overcomes these problems by using an improved amplifier that provides low-input capacitance and reduced 1/f noise without the need to tune the fabrication line. Refer now to FIG. 2, which is a schematic drawing of an imaging element 50 according to the present invention. To simplify the following discussion, those components of imaging element 50 that serve the same function as elements shown in FIG. 1 have been assigned the same numeric designations and will not be discussed further here. Imaging element 50 utilizes an amplifier having three sections, a PMOS follower input stage 51, a capacitive level shifter 52, and a cascode CMOS single ended amplifier 53.

The PMOS follower consists of transistors 61 and 62 and is designed to reduce the capacitive load. That is, transistor 62 is relatively small compared to the input transistor 66 of the cascode amplifier. For example, the area of transistor 62 is typically $\frac{1}{4}^{th}$ of the area of transistor 66. PMOS transistors are preferred in the input stage of the follower because PMOS processes typically have one to two orders of magnitude less 1/f noise than NMOS transistors of the same size.

However, other forms of voltage followers can be utilized if the specific fabrication has low 1/f noise.

The PMOS follower output is capacitively isolated from amplifier 53 by a PMOS transistor that has its collector and emitter shorted to its base. A transistor, rather than a capacitor, is used here because the transistor is more easily implemented in conventional fabrication processes. However, a capacitor could be used for this purpose.

The cascode amplifier consists of transistors 63–66 and is controlled by bias levels $V_{B1}$–$V_{B3}$. Amplifier 53 provides a large voltage gain while maintaining low 1/f noise by using large NMOS transistors. Since the input of amplifier 53 is isolated from the amplifier input by the PMOS follower, these large transistors do not capacitively load the input. While the preferred embodiment of the present invention utilizes a cascode amplifier for this stage, any amplifier that provides the high load with low 1/f noise could be utilized.

Amplifier 53 also includes a reset switch 67 for shorting the output of the level shifter to the amplifier output. This prevents charge build-up on the input to the cascode amplifier. Reset switch 67 is activated by the same reset pulse used to activate reset transistor 25.

The above-described embodiments of the present invention utilize a cascode amplifier to provide the final gain. However, embodiments in which other forms of amplifiers are utilized in place of cascode amplifier 53 can also be constructed without deviating from the teachings of the present invention. For example, a single or multiple stage amplifier could be used in place of the cascode amplifier.

Various modifications to the present invention will become apparent to those skilled in the art from the foregoing description and accompanying drawings. Accordingly, the present invention is to be limited solely by the scope of the following claims.

What is claimed is:

1. An imaging element comprising a photodiode and an amplifier for providing an output signal indicative of the voltage across said photodiode, wherein said amplifier comprises:
    an input follower having a follower output comprising a signal related to said voltage across said photodiode;
    a capacitive level shifter having a first terminal connected to said follower output; and
    an output amplifier having an input connected to a second terminal of said capacitive level shifter, said output amplifier generating said output signal on an output terminal thereof.

2. An imaging element comprising a photodiode and an amplifier for providing an output signal indicative of the voltage across said photodiode, wherein said amplifier comprises:
    an input follower having a follower output comprising a signal related to said voltage across said photodiode;
    a level shifter having a first terminal connected to said follower output; and
    an output amplifier having an input connected to a second terminal of said level shifter, said output amplifier generating said output signal on an output terminal thereof,
    wherein said input follower comprises an input transistor connected to said photodiode,
    wherein said output amplifier has an input transistor connected to said input of said output transistor, the area of said input transistor in said input follower being less than the area of said input transistor in said output amplifier.

3. An imaging element comprising a photodiode and an amplifier for providing an output signal indicative of the voltage across said photodiode, wherein said amplifier comprises:
    an input follower having a follower output comprising a signal related to said voltage across said photodiode;
    a level shifter having a first terminal connected to said follower output; and
    an output amplifier having an input connected to a second terminal of said level shifter, said output amplifier generating said output signal on an output terminal thereof,
    wherein said input follower utilizes PMOS transistors.

4. An imaging element comprising a photodiode and an amplifier for providing an output signal indicative of the voltage across said photodiode, wherein said amplifier comprises:
    an input follower having a follower output comprising a signal related to said voltage across said photodiode;
    a level shifter having a first terminal connected to said follower output; and
    an output amplifier having an input connected to a second terminal of said level shifter, said output amplifier generating said output signal on an output terminal thereof,
    wherein said level shifter comprises a MOS transistor having the drain, source, and body connected together.

5. An imaging element comprising a photodiode and an amplifier for providing an output signal indicative of the voltage across said photodiode, wherein said amplifier comprises:
    an input follower having a follower output comprising a signal related to said voltage across said photodiode;
    a level shifter having a first terminal connected to said follower output; and
    an output amplifier having an input connected to a second terminal of said level shifter, said output amplifier generating said output signal on an output terminal thereof,
    wherein said level shifter comprises a capacitor.

6. The imaging element of claim 1 wherein said output amplifier comprises a cascode amplifier.

7. An imaging element comprising a photodiode and an amplifier for providing an output signal indicative of the voltage across said photodiode, wherein said amplifier comprises:
    an input follower having a follower output comprising a signal related to said voltage across said photodiode;
    a level shifter having a first terminal connected to said follower output; and
    an output amplifier having an input connected to a second terminal of said level shifter, said output amplifier generating said output signal on an output terminal thereof;
    wherein said output amplifier further comprises a reset switch for shorting input of said output amplifier to said output terminal of said output amplifier.

8. An amplifier comprising an amplifier input and an amplifier output, said amplifier generating an amplifier output signal having a magnitude related to an amplifier input signal, said amplifier comprising:
    an input follower having a follower output comprising a signal related to said voltage across said amplifier input;

a capacitive level shifter having a first terminal connected to said follower output; and an output amplifier having an input connected to a second terminal of said capacitive level shifter, said output amplifier generating said amplifier output signal on an output terminal thereof.

9. An amplifier comprising an amplifier input and an amplifier output, said amplifier generating an amplifier output signal having a magnitude related to an amplifier input signal, said amplifier comprising:

an input follower having a follower output comprising a signal related to said voltage across said amplifier input;

a level shifter having a first terminal connected to said follower output; and an output amplifier having an input connected to a second terminal of said level shifter, said output amplifier generating said amplifier output signal on an output terminal thereof, wherein said input follower comprises an input transistor connected to said photodiode, wherein said output amplifier has an input transistor connected to said input of said output transistor, the area of said input transistor in said input follower being less than the area of said input transistor in said output amplifier.

10. An amplifier comprising an amplifier input and an amplifier output, said amplifier generating an amplifier output signal having a magnitude related to an amplifier input signal, said amplifier comprising:

an input follower having a follower output comprising a signal related to said voltage across said amplifier input;

a level shifter having a first terminal connected to said follower output; and an output amplifier having an input connected to a second terminal of said level shifter, said output amplifier generating said amplifier output signal on an output terminal thereof, wherein said input follower utilizes PMOS transistors.

11. An amplifier comprising an amplifier input and an amplifier output, said amplifier generating an amplifier output signal having a magnitude related to an amplifier input signal, said amplifier comprising:

an input follower having a follower output comprising a signal related to said voltage across said amplifier input;

a level shifter having a first terminal connected to said follower output; and an output amplifier having an input connected to a second terminal of said level shifter, said output amplifier generating said amplifier output signal on an output terminal thereof, wherein said level shifter comprises a transistor having the collector and emitter shorted to the base thereof.

12. An amplifier comprising an amplifier input and an amplifier output, said amplifier generating an amplifier output signal having a magnitude related to an amplifier input signal said amplifier comprising:

an input follower having a follower output comprising a signal related to said voltage across said amplifier input;

a level shifter having a first terminal connected to said follower output; and an output amplifier having an input connected to a second terminal of said level shifter, said output amplifier generating said amplifier output signal on an output terminal thereof, wherein said level shifter comprises a capacitor.

13. The amplifier of claim 8 wherein said output amplifier comprises a cascode amplifier.

14. An amplifier comprising an amplifier input and an amplifier output, said amplifier generating an amplifier output signal having a magnitude related to an amplifier input signal, said amplifier comprising:

an input follower having a follower output comprising a signal related to said voltage across said amplifier input;

a level shifter having a first terminal connected to said follower output; and an output amplifier having an input connected to a second terminal of said level shifter, said output amplifier generating said amplifier output signal on an output terminal thereof, wherein said output amplifier further comprises a reset switch for shorting the input of said output amplifier to said output terminal of said output amplifier.

* * * * *